United States Patent
Dosho (10) Patent No.: US 7,078,948 B2
(45) Date of Patent: Jul. 18, 2006

(54) LOW-PASS FILTER, FEEDBACK SYSTEM, AND SEMICONDUCTOR INTEGRATED CIRCUIT

(75) Inventor: Shiro Dosho, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 6 days.

(21) Appl. No.: 10/815,672

(22) Filed: Apr. 2, 2004

(65) Prior Publication Data

US 2004/0212440 A1    Oct. 28, 2004

(30) Foreign Application Priority Data

Apr. 25, 2003    (JP)    ............... 2003-121647

(51) Int. Cl.
*H04B 7/197* (2006.01)
(52) U.S. Cl. .................... 327/157; 327/156; 331/16
(58) Field of Classification Search ........ 327/156–159, 327/147–148, 558; 331/17, 172, 16
See application file for complete search history.

(56) References Cited

U.S. PATENT DOCUMENTS

| | | | |
|---|---|---|---|
| 5,180,993 A * | 1/1993 | Dent | .............. 331/16 |
| 5,424,689 A | 6/1995 | Gillig et al. | |
| 5,727,037 A * | 3/1998 | Maneatis | ............ 375/376 |
| 5,774,023 A * | 6/1998 | Irwin | ............ 331/17 |
| 6,344,772 B1 | 2/2002 | Larsson | |
| 6,417,739 B1 * | 7/2002 | Chacko | ............ 331/17 |
| 6,546,059 B1 | 4/2003 | Knoll et al. | |
| 6,600,351 B1 * | 7/2003 | Bisanti et al. | ............ 327/157 |
| 6,954,511 B1 * | 10/2005 | Tachimori | ............ 375/376 |
| 2002/0149429 A1 | 10/2002 | Sander | |

FOREIGN PATENT DOCUMENTS

| | | |
|---|---|---|
| EP | 0 429 421 A1 | 5/1991 |
| JP | 27-78421 | 5/1998 |
| WO | WO 03/098807 A1 | 11/2003 |

\* cited by examiner

*Primary Examiner*—Dinh T. Le
(74) *Attorney, Agent, or Firm*—McDermott Will & Emery LLP (57) ABSTRACT

In a low-pass filter which is preferably used as a loop filter in a PLL or DLL, filter characteristics which are the same as those of a conventional low-pass filter are realized without causing collateral problems, such as an increase in the circuit area, the circuit complexity, or the resistance value, which may be caused due to size reduction of a capacitive element in the conventional low-pass filter. Thus, in a loop filter including a capacitive element and a resistive element which are connected in series, the first input terminal is provided at the side including the resistive element, and the second input terminal is provided at a connection point of the capacitive element and the resistive element. The first input terminal is supplied with the first electric current. On the other hand, the second electric current, which is a part of the first electric current supplied to the first input terminal, is extracted from the second input terminal, so that the electric current flowing into the capacitive element is smaller than the electric current flowing through the resistive element.

10 Claims, 12 Drawing Sheets

⇕ Equivalent conversion (b)

⇕ Equivalent conversion (c)

Equivalent conversion (b)

Equivalent conversion (c)

LSI device incorporating PLL or DLL of the present invention

Application to IC card

FIG. 10

COC component incorporating PLL or DLL of the present invention

Base material to which COC component is attached

Application to COC component

FIG. 11

Installation in LSI pad

FIG. 12

Installation in MPU clock

LOW-PASS FILTER, FEEDBACK SYSTEM, AND SEMICONDUCTOR INTEGRATED CIRCUIT

BACKGROUND OF THE INVENTION

The present invention relates to a low-pass filter and specifically to a technique of a low-pass filter suitable for use as a loop filter in a feedback system, such as a phase locked loop circuit, a delay locked loop, or the like.

In currently-existing semiconductor integrated circuit systems, a feedback system, especially a phase locked loop circuit (hereinafter, referred to as "PLL"), is one of the indispensable components and is incorporated in almost all the LSI devices. The applications of the feedback system range over various technological fields, such as communication devices, microprocessors, IC cards, etc.

Figure 13:
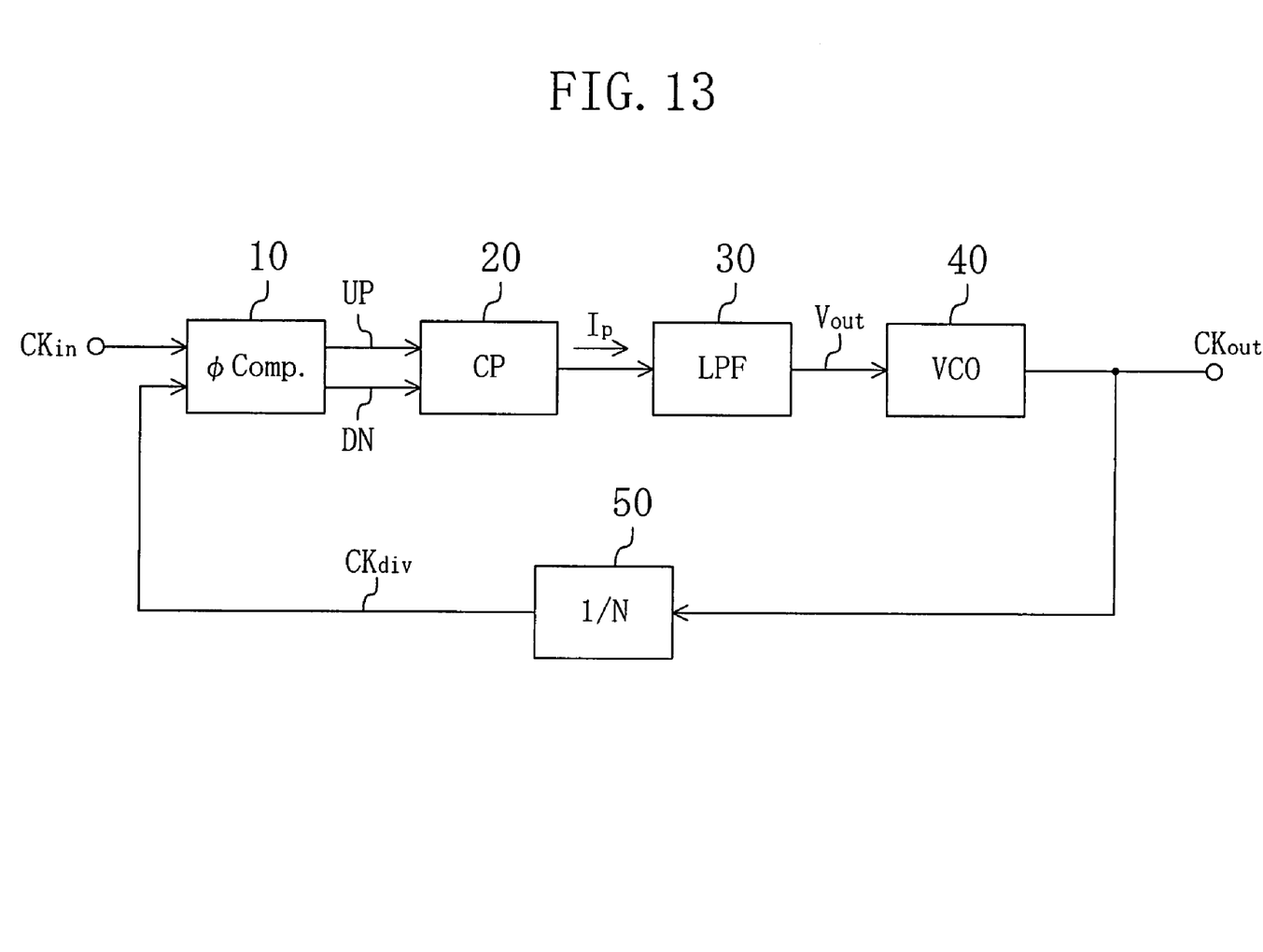
FIG. 13 shows the structure of a general charge pump PLL.

FIG. 13 shows the structure of a general charge pump type PLL. General features of the PLL are described with reference to FIG. 13. A phase comparator 10 compares input clock CKin which is supplied to the PLL and feed back clock CKdiv and outputs up signal UP and down signal DN according to the phase difference between the compared clocks. A charge pump circuit 20 outputs (releases or sucks) electric current Ip based on up signal UP and down signal DN. A loop filter 30 smoothes electric current Ip and outputs voltage Vout as a result of the smoothing of electric current Ip. A voltage controlled oscillator 40 changes the frequency of output clock CKout of the PLL based on voltage Vout. A frequency divider 50 divides output clock CKout by N, and a resultant clock is fed back as feedback clock CKdiv to the phase comparator 10. By repeating the above operation, output clock CKout gradually converges on a predetermined frequency and is locked.

The loop filter 30 is an especially significant component among the above components of the PLL. It can be said that the response characteristic of the PLL is determined according to the filter characteristics of the loop filter 30.

Figure 14A:
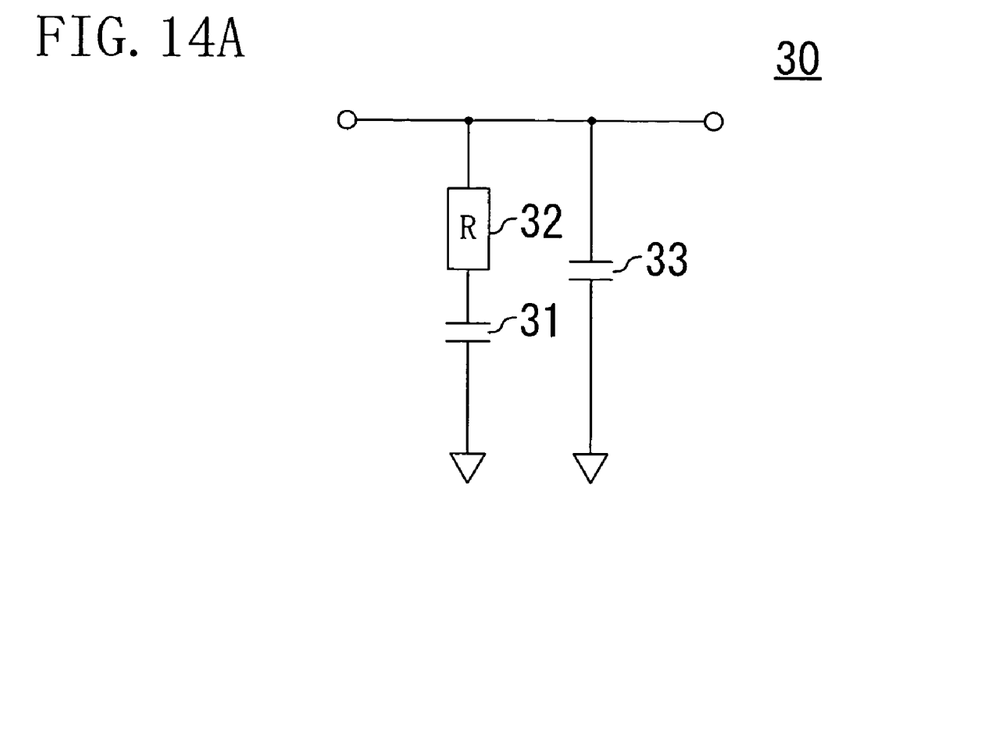
FIGS. 14A and 14B are circuit diagrams of a general loop filter.
Figure 14B:
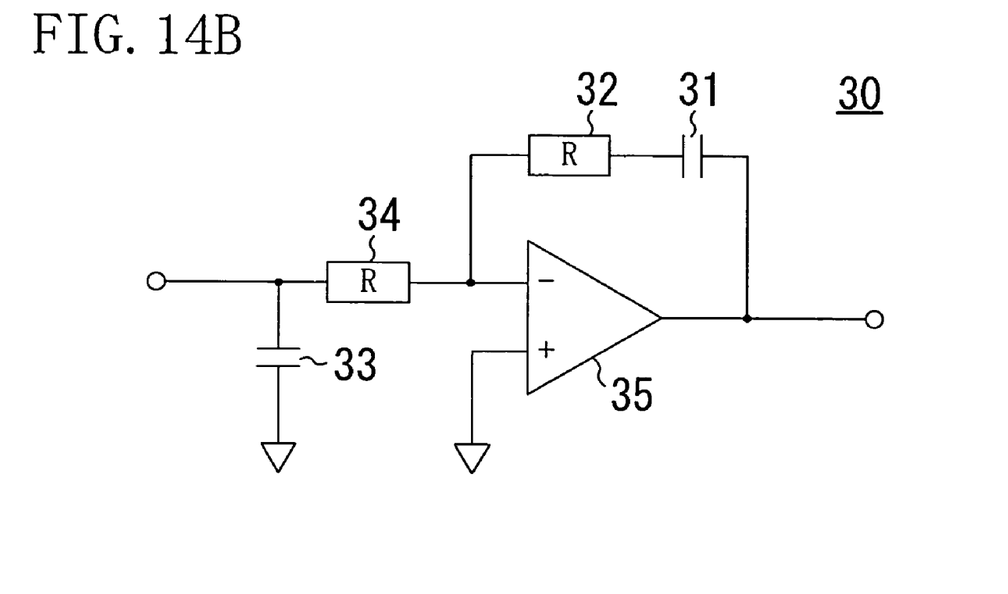

FIGS. 14A and 14B show general loop filters. FIG. 14A shows a passive filter. FIG. 14B shows an active filter. These filters are equivalently replaceable with each other and have the same transfer characteristic. As seen from FIGS. 14A and 14B, the loop filter 30 is substantially a low-pass filter formed by a combination of a resistive element and a capacitive element irrespective of whether it is a passive filter or an active filter.

According to the control theory for PLLs, the response bandwidth of the PLL is preferably about a ⅒ of the frequency of the input clock at the maximum. If this theory is followed, in a PLL which receives a reference clock having a relatively low frequency, it is necessary to reduce the cutoff frequency of the loop filter such that the response bandwidth is narrowed. Thus, a loop filter in a conventional PLL has a relatively large time constant, i.e., a large CR product. In general, a larger capacitive element is used in order to achieve a larger CR product.

However, increasing the size of the capacitive element is causes an increase in the circuit size. This is a serious problem especially in a semiconductor integrated circuit including a large number of PLLs, such as a microprocessor, or the like. Further, especially in an IC card, it should be avoided, in view of reliability, to incorporate an element thicker than the card. The countermeasure of externally providing a large capacitive element is substantially impossible. Conventionally, the following means have been provided for the purpose of decreasing the size of the capacitive element of the loop filter.

In the first countermeasure example, a loop filter is structured such that a capacitive element and a resistive element, which would generally be connected in series, are separated, and separate electric currents are supplied to these elements. The voltages generated in the elements are added together in an adder circuit, and a resultant voltage is output from the adder circuit (see, for example, the specification of Japanese Patent No. 2778421 (page 3 and FIG. 1)). According to this loop filter, the electric current supplied to the capacitive element is smaller than that supplied to the resistive element, whereby the filter characteristics equivalent to those of a conventional filter are maintained, and the size of the capacitive element is relatively decreased.

The second countermeasure example is a low-pass filter disclosed in a patent application in which the present inventors are concerned (WO 03/098807 A1). In this low-pass filter, a filtering process of an input signal is performed by first filter means, and a filtering process of a second electric current generated based on first electric current flowing through the first filter means is performed by second filter means. Further, the first and second voltages generated in the first and second filter means, respectively, are added together by adder means and a resultant voltage is output from the low-pass filter. In this circuit, the second electric current is generated so as to be smaller than the first electric current, whereby the size of a capacitive element of the second filter means is relatively decreased while the filter characteristics equivalent to those of a conventional low-pass filter are maintained.

In the above first and second examples, the objective of reducing the size of the capacitive element is achieved, but on the other hand, collateral problems emerge. For example, in the first example, it is necessary to provide an adder circuit even when a passive loop filter is constructed, and accordingly, the circuit area and circuit complexity are increased. The second example is originally directed to an active loop filter and therefore basically includes an operational amplifier. Therefore, the second example does not require an additional addition means that is required in the first example. A problem in the second example is that the resistance value of a resistive element in electric current generation means which generates the second electric current is increased although the second electric current is decreased and the size of the capacitive element in the second filter means is decreased. The increase of the resistance value undesirably causes a deterioration in the noise characteristics because the resistor generates thermal noise.

SUMMARY OF THE INVENTION

In view of the above problems, an objective of the present invention is to achieve a low-pass filter having filter characteristics equivalent to those of a conventional low-pass filter without causing collateral problems, such as an increase in the circuit area, the circuit complexity, or the resistance value, which may be caused due to size reduction of a capacitive element in the conventional low-pass filter. Another objective of the present invention is to provide a feedback system including such a low-pass filter of the present invention as a loop filter and a semiconductor integrated circuit including such a feedback system.

A measure taken by the present invention for achieving the above objectives is a low-pass filter comprising: a first element block having a capacitive element; a second element block having a resistive element, the second element block being connected in series to the first element block; a first input terminal for receiving a first electric current, the first input terminal being provided at the side including any one of the first and second element blocks; and a second input terminal for receiving a second electric current, the second input terminal being connected to a connection point of the first element block and the second element block, wherein the total voltage generated in the first and second element blocks is employed as an output signal. The first element block receives at least a part of the first electric current which corresponds to a difference between the electric current flowing through the second element block and the second electric current.

With this structure, the electric current flowing through the first element block is smaller that the electric current flowing through the second element block. In the case where the electric current flows from the first element block to the second element block, the second electric current which is received at the second input terminal is merged into the electric current flowing through the first element block, and the resultant electric current flows through the second element block. In the case where the electric current flows from the second element block to the first element block, the electric current flowing through the second element block is divided and supplied to the second input terminal as the second electric current. Therefore, only the size of the capacitive element of the first element block is relatively decreased without increasing the resistance value of a resistive element in the second element block, whereby the voltage generated in the first and second element blocks is maintained. Thus, the size of the capacitive element in the low-pass filter is decreased without causing collateral problems, such as an increase in the resistance value or the circuit complexity, or the like.

Specifically, in the above-described low-pass filter, the first input terminal is provided at the side including the second element block; and the second electric current is an electric current whose direction is opposite to that of the first electric current and whose magnitude is N times that of the first electric current (where N is a predetermined number).

Specifically, in the above-described low-pass filter, the first input terminal is provided at the side including the first element block; and the second electric current is an electric current whose direction is the same as that of the first electric current and whose magnitude is N times that of the first electric current (where N is a predetermined number).

Preferably, the above-described low-pass filter further comprises a third element block which has a capacitive element and is provided between the first input terminal and a reference voltage. With this structure, a secondary low-pass filter can be constructed.

Preferably, the above-described low-pass filter further comprises an operational amplifier which has a normal phase input terminal, an inverted phase input terminal, and an output terminal, wherein: the first and second element blocks are provided between the inverted phase input terminal and the output terminal of the operational amplifier, and the normal phase input terminal of the operational amplifier is supplied with a reference voltage; and the first input terminal is provided at the side including the inverted phase input terminal of the operational amplifier. With this structure, an active low-pass filter can be constructed.

A variation of the above-described low-pass filter is a low-pass filter comprising: a first element block having a capacitive element; a second element block having a resistive element, the second element block being connected in series to the first element block; an operational amplifier having a normal phase input terminal, an inverted phase input terminal, and an output terminal, the first and second element blocks being provided between the inverted phase input terminal and the output terminal, the normal phase input terminal being supplied with a reference voltage; a first input terminal for receiving a first electric current; a second input terminal for receiving a second electric current, the second input terminal being connected to the inverted phase input terminal of the operational amplifier; and a third element block having a capacitive element and a resistive element, the capacitive element being provided between the first input terminal and the reference voltage, the resistive element being provided between the first input terminal and the inverted phase input terminal of the operational amplifier, wherein the total voltage generated in the first and second element blocks is employed as an output signal. The first element block receives at least a part of the first electric current which corresponds to a difference between the electric current flowing through the resistive element of the third element block and the second electric current.

In this low-pass filter, the second input terminal is provided not between the first element block and the second element block but between the first and second element blocks and the third element block. With this structure, the electric current flowing through the first element block is smaller than the electric current flowing through the resistive element of the third element block. In the case of this low-pass filter, the resistance value of the resistive element in the second element block increases, but the size of the capacitive element in the first element block decreases.

Another measure taken by the present invention for achieving the above objectives is a feedback system for feeding back an output clock generated based on an input clock such that the output clock has a predetermined characteristic, comprising: a loop filter including a first element block which has a capacitive element, a second element block which has a resistive element and is connected in series to the first element block, a first input terminal for receiving a first electric current which is provided at the side including any one of the first and second element blocks, and a second input terminal for receiving a second electric current, which is connected to a connection point of the first and second element blocks, the first element block receiving at least a part of the first electric current which corresponds to a difference between the electric current flowing through the second element block and the second electric current, the total voltage generated in the first and second element blocks being employed as an output signal; a charge pump circuit for generating the first and second electric currents based on a phase difference between the input clock and the fed-back clock; and output clock generation means for generating the output clock based on the output signal from the loop filter.

In this way, a filter having the same structure as that described above is used as a loop filter in a feedback system, whereby the circuit area of the entire feedback system is reduced.

Specifically, the output clock generation means is a voltage controlled oscillator which oscillates the output clock and changes the oscillation frequency based on the output signal from the loop filter.

Specifically, the output clock generation means is a voltage controlled delay circuit which changes a delay amount of the output clock with respect to the input clock based on the input clock and the output signal from the loop filter.

Specifically, in the above-described feedback system, the first input terminal of the loop filter is provided at the side including the second element block. The direction of the second electric current is opposite to that of the first electric current, and the magnitude of the second electric current is N times that of the first electric current (where N is a predetermined number). The charge pump circuit includes a first partial charge pump circuit which outputs/receives the first electric current and a second partial charge pump circuit which outputs/receives the second electric current.

Specifically, in the above-described feedback system, the first input terminal of the loop filter is provided at the side including the second element block. The direction of the second electric current is opposite to that of the first electric current, and the magnitude of the second electric current is N times that of the first electric current (where N is a predetermined number). The charge pump circuit includes a first partial charge pump circuit which outputs/receives an electric current corresponding to a difference between the first electric current and the second electric current and a second partial charge pump circuit which outputs/receives the second electric current, the charge pump circuit combining the electric currents output from/received by the first and second partial charge pump circuits to obtain the first electric current.

Specifically, in the above-described feedback system, the first input terminal of the loop filter is provided at the side including the first element block. The direction of the second electric current is the same as that of the first electric current, and the magnitude of the second electric current is N times that of the first electric current (where N is a predetermined number). The charge pump circuit includes a first partial charge pump circuit which outputs/receives the first electric current and a second partial charge pump circuit which outputs/receives the second electric current.

DESCRIPTION OF THE PREFERRED EMBODIMENTS

Hereinafter, embodiments of the present invention are described with reference to the drawings.

Embodiment 1

Figure 1:
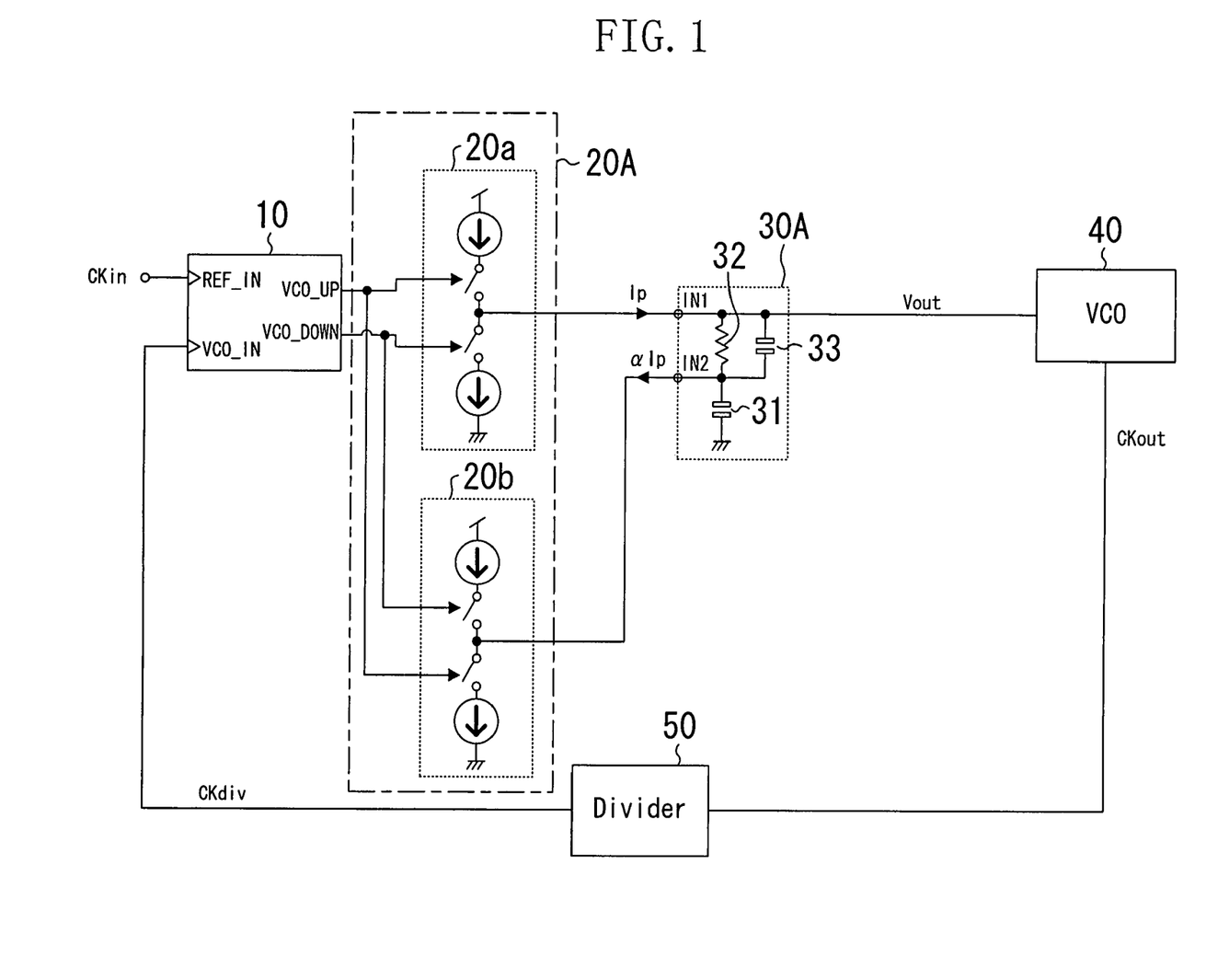
FIG. 1 shows the structure of a feedback system according to embodiment 1 of the present invention.

FIG. 1 shows the structure of a feedback system according to embodiment 1 of the present invention. The feedback system of embodiment 1 is a PLL including a phase comparator 10, a charge pump circuit 20A, a loop filter 30A, a voltage controlled oscillator (output clock generation means) 40, and a frequency divider 50. Among these components, the phase comparator 10, the voltage controlled oscillator 40, and the frequency divider 50 are as described above. Hereinafter, the charge pump circuit 20A and the loop filter 30A are described in detail.

The charge pump circuit 20A includes two general charge pump circuits (partial charge pump circuits) 20a and 20b. The charge pump circuit 20a outputs/receives electric current Ip according to signal UP and signal DN which are output from the phase comparator 10. The charge pump circuit 20b outputs/receives electric current $\alpha$Ip according to signal UP and signal DN. The direction of electric current $\alpha$Ip is opposite to that of electric current Ip. The magnitude of electric current $\alpha$Ip is $\alpha$ times that of electric current Ip ($0<\alpha<1$). That is, the charge pump circuit 20A outputs/receives two lines of electric currents, electric current Ip and opposite electric current $\alpha$Ip, according to signal UP and signal DN.

Electric currents Ip and $\alpha$Ip output from/input to the charge pump circuit 20A are input to the loop filter 30A at input terminals IN1 and IN2, respectively. In the loop filter 30A, a capacitive element (first element block) 31 is provided between input terminal IN2 and a reference voltage. Further, a resistive element 32 and a capacitive element 33, which are connected in parallel and constitute the second element block, are provided between input terminal IN1 and input terminal IN2. The loop filter 30A outputs voltage Vout of input terminal IN1, i.e., a total voltage generated in the capacitive element 31 and the resistive element 32.

In the loop filter 30A, electric current Ip supplied at input terminal IN1 flows through the resistive element 32 and the capacitive element 33 which are connected in parallel. Electric current $\alpha$Ip, which is a part of electric current Ip, is extracted from input terminal IN2. Thus, only a part of the electric current flowing through the resistive element 32 and the capacitive element 33, which are connected in parallel, is allowed to flow through the capacitive element 31. Accordingly, the static capacitance of the capacitive element 31 may be relatively decreased. The total voltage generated in a downsized version of the capacitive element 31 and the resistive element 32 is equal to the voltage generated when electric current Ip is supplied at input terminal IN1 in the structure where input terminal IN2 is not provided, and the size of the capacitive element 31 is not decreased.

Figure 2:
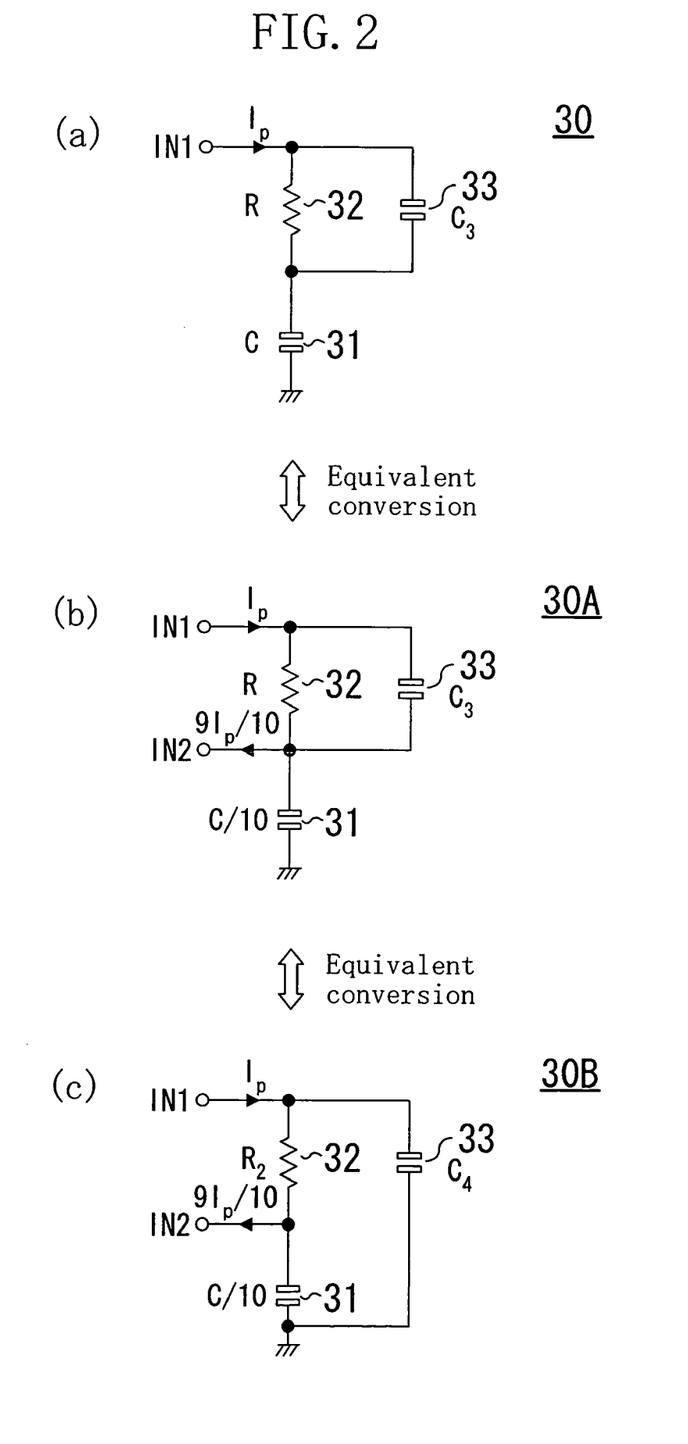
FIGS. 2A–2C show circuit diagrams of a general passive filter and low-pass filters according to embodiment 1 of the present invention.

FIG. 2 shows the circuit structures of a general passive filter and low-pass filters according to embodiment 1. A loop filter 30 shown in part (a) of FIG. 2 is a general low-pass filter having a transfer characteristic equivalent to that of the loop filter 30 shown in FIG. 14A. Herein, input terminal IN2 is provided between the capacitive element 31 and the resistive element 32. Electric current 9Ip/10 is supplied to input terminal IN2 in the direction opposite to that of electric current Ip that is supplied to input terminal IN1. The static capacitance of the capacitive element 31 is multiplied by ⅒.

As a result, the low-pass filter shown in part (b) of FIG. 2, i.e., the loop filter 30A of embodiment 1, is obtained. The loop filter 30 shown in part (a) of FIG. 2 and the loop filter 30A shown in part (b) of FIG. 2 have the same transfer function which is expressed by the following expression:

$$1+(C_3R+RC)s/(s(1+sC_3R)C) \qquad (1)$$

As described above, the loop filter 30A of embodiment 1 has a transfer characteristic equivalent to that of the general passive loop filter 30, but the static capacitance of the capacitive element 31 in the loop filter 30A is smaller than in the conventional loop filter 30. The reduction in the static capacitance of the capacitive element 31 does not require an increase in the resistance value of the resistive element 32 as compensation. Further, it is not necessary to additionally provide an adder circuit for adding together the voltage generated in the capacitive element 31 and the voltage generated in the resistive element 32. That is, a passive loop filter having a greatly reduced size as compared with the conventional passive loop filter 30 is realized only by providing input terminal IN2 and supplying a predetermined electric current thereto without making any modification to the circuit structure of the conventional passive loop filter 30.

The loop filter 30A can be equivalently converted to a loop filter 30B shown in part (c) of FIG. 2 by adjusting respective element values so as to satisfy the following condition:

$$(1+C_3/C)/(RC_3)=(1+10C_4/C)/(R_2C_4) \qquad (2)$$

The loop filter 30B includes a capacitive element (first element block) 31, a resistive element (second element block) 32 which is connected in series to the capacitive element 31, and a capacitive element (third element block) 33 which is connected to input terminal IN1. One end of the capacitive element 33 is connected to the reference voltage. The circuit structure of the loop filter 30B is substantially the same as that of the conventional passive filter shown in FIG. 14A. In FIG. 1, as a matter of course, the loop filter 30A may be replaced with the loop filter 30B.

As described above, according to embodiment 1, a loop filter having a transfer characteristic equivalent to that of a conventional passive loop filter is realized only by decreasing the static capacitance of a capacitive element without making any substantial modification to the circuit structure of the conventional passive loop filter and without increasing the resistance value of a resistive element in the loop filter.

In the example described above, the static capacitance of the capacitive element 31 is multiplied by ⅒, but the present invention is not limited thereto. For example, electric current 99Ip/100 may be supplied to input terminal IN2, whereby the static capacitance of the capacitive element 31 is reduced to a 1/100. It is apparent that the static capacitance of the capacitive element 31 is further reduced.

Embodiment 2

Figure 3:
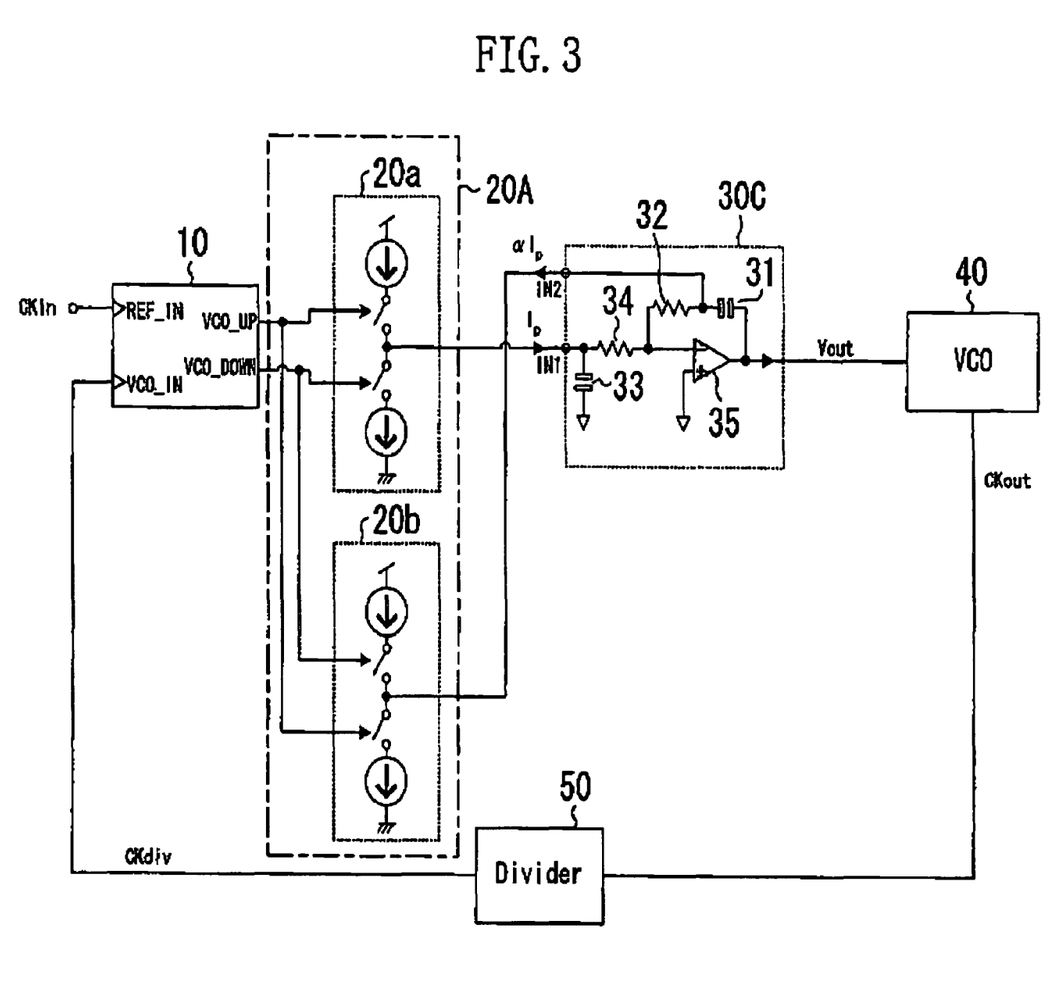
FIG. 3 shows the structure of a feedback system according to embodiment 2 of the present invention.

FIG. 3 shows the structure of a feedback system according to embodiment 2 of the present invention. The feedback system of embodiment 2 is a PLL including an active loop filter 30C, whereas the feedback system of embodiment 1 is a PLL including the passive loop filter 30A. The components of the PLL of embodiment 2 are as described in embodiment 1 except for the loop filter 30C. Hereinafter, the loop filter 30C is described in detail.

The loop filter 30C includes a capacitive element (first element block) 31, a resistive element (second element block) 32 connected in series to the capacitive element 31, a capacitive element (third element block) 33, a resistive element 34, and an operational amplifier 35. The output terminal of the operational amplifier 35 is connected to one end of the capacitive element 31. The inverted phase input terminal of the operational amplifier 35 is connected to a connection point of the resistive element 32 and the resistive element 34. The normal phase input terminal of the operational amplifier 35 is supplied with a reference voltage. In the loop filter 30C, input terminal IN1 is connected to a connection point of the capacitive element 33 and the resistive element 34, and input terminal IN2 is connected to a connection point of the capacitive element 31 and the resistive element 34. The loop filter 30C receives electric current Ip and electric current αIp output from/input to the charge pump circuit 20A at input terminals IN1 and IN2, respectively. The loop filter 30C outputs voltage Vout of the output terminal of the operational amplifier 35, i.e., the total voltage generated in the capacitive element 31 and the resistive element 32.

In the loop filter 30C, a part of electric current Ip which is supplied at input terminal IN1 flows through the resistive element 32, and electric current αIp, which is a part of the electric current passed through the resistive element 32, is extracted through input terminal IN2. Thus, only a part of the electric current passed through the resistive element 32 flows into the capacitive element 31, and therefore, the static capacitance of the capacitive element 31 can be relatively decreased. The voltage obtained at the output terminal of the operational amplifier 35 in the case of a downsized version of the capacitive element 31 is equal to the voltage generated when electric current Ip is supplied at input terminal IN1 in the structure where input terminal IN2 is not provided, and the size of the capacitive element 31 is not decreased.

Figure 4:
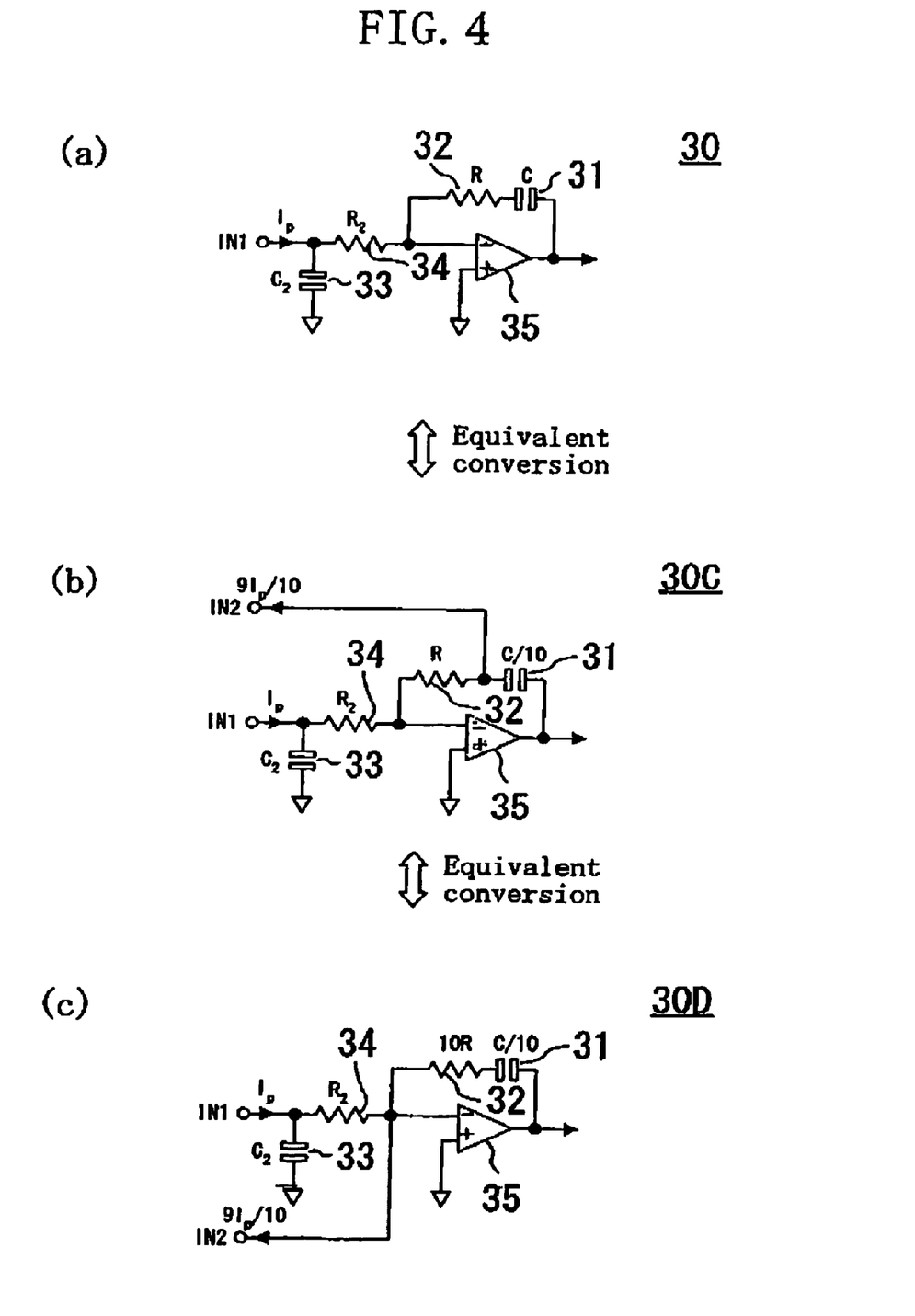
FIGS. 4A–4C show circuit diagrams of a general active filter and low-pass filters according to embodiment 2 of the present invention.

FIG. 4 shows circuit structures of a general active filter and low-pass filters according to embodiment 2 of the present invention. The loop filter 30 shown in part (a) of FIG. 4 is the same as the loop filter 30 shown in FIG. 14B. Herein, input terminal IN2 is provided between the capacitive element 31 and the resistive element 32. Electric current 9Ip/10 is supplied at input terminal IN2 in the direction opposite to that of electric current Ip supplied at input terminal IN1, and the static capacitance of the capacitive element 31 is multiplied by ⅒, whereby a low-pass filter shown in part (b) of FIG. 4, i.e., the loop filter 30C of embodiment 2, is obtained. The loop filter 30 shown in part (a) of FIG. 4 and the loop filter 30C shown in part (b) of FIG. 4 have the same transfer function which is substantially expressed by expression (1).

As described above, the loop filter 30C of embodiment 2 has a transfer characteristic equivalent to that of the general active loop filter 30, but the static capacitance of the capacitive element 31 in the loop filter 30C is smaller than in the conventional loop filter 30. The reduction in the static capacitance of the capacitive element 31 does not require an increase in the resistance value of the resistive element 32 as compensation. That is, a loop filter having a greatly reduced size as compared with the conventional passive loop filter 30 is realized only by providing input terminal IN2 and supplying a predetermined electric current thereto without making any modification to the circuit structure of the conventional passive loop filter 30.

The loop filter 30C can be equivalently converted to the loop filter 30D shown in part (c) of FIG. 4. The loop filter 30D is different from the loop filter 30C in that input terminal IN2 is connected to the inverted phase input terminal of the operational amplifier 35, i.e., connected to a connection point of the resistive element 32 and the resistive element 34. Also in the loop filter 30D, the electric current flowing into the capacitive element 31 is decreased, and accordingly, the static capacitance of the capacitive element 31 is relatively decreased. However, the electric current flowing through the resistive element 32 is also decreased, and therefore, the resistance value of the resistive element 32 is set to a relatively large value. In FIG. 3, the loop filter 30C may be replaced with the loop filter 30D.

As described above, according to embodiment 2, a loop filter having a transfer characteristic equivalent to that of a conventional active loop filter is realized only by decreasing the static capacitance of a capacitive element without making any substantial modification to the circuit structure of the conventional active loop filter and, in some cases, without increasing the resistance value of a resistive element in the loop filter.

Also in embodiment 2, the static capacitance of the capacitive element 31 may be reduced to a 1/100 by supplying, for example, electric current 99Ip/100 to input terminal IN2. It is apparent that the static capacitance of the capacitive element 31 may further be reduced.

In embodiments 1 and 2, the charge pump circuit 20A includes two general charge pump circuits 20a and 20b. The charge pump circuits 20a and 20b respectively output/receive electric currents Ip and αIp which have opposite polarities. Thus, in one of the charge pump circuits 20a and 20b, the electric current source for charge and the electric current source for discharge do not operate simultaneously. Therefore, the charge pump circuit 20A can be replaced with the charge pump circuit 20B shown in FIG. 5.

Figure 5:
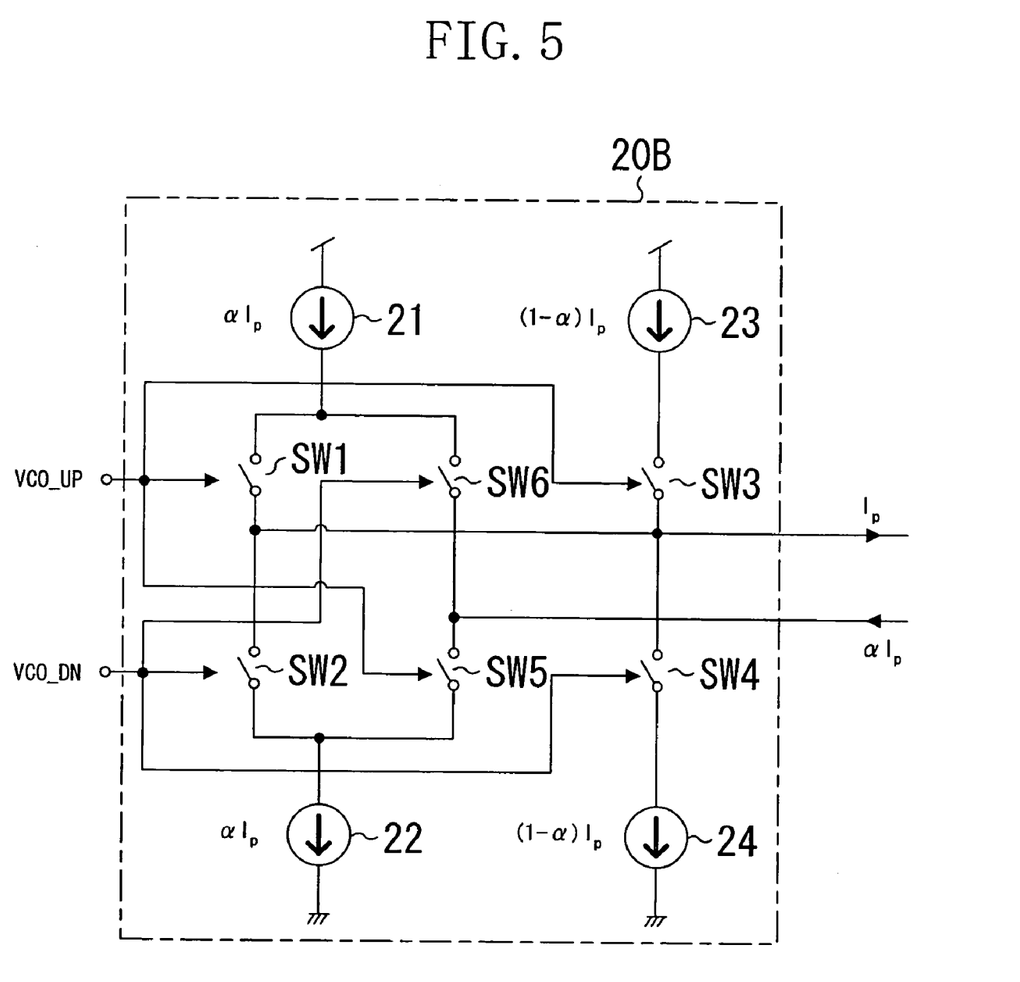
FIG. 5 is a circuit diagram of a charge pump circuit provided in the feedback systems according to embodiments 1 and 2 of the present invention.

The charge pump circuit 20B includes electric current sources 21, 22, 23 and 24. However, among there sources, the electric current sources 21 and 23 merely resulted from dividing a conventional current source which supplies electric current Ip such that supplied electric currents have a ratio of α:(1−α). This also applies to the electric current sources 22 and 24. When signal UP is supplied, control switches SW1, SW3 and SW5 are brought into conduction, so that electric current Ip, which is the sum of the electric currents supplied from the electric current sources 21 and 23, is released from the charge pump circuit 20B, and electric current αIp is sucked into the charge pump circuit 20B. On the other hand, when signal DN is supplied, control switches SW2, SW4 and SW6 are brought into conduction, so that electric current Ip, which is the sum of the electric currents supplied from the electric current sources 22 and 24, is sucked into the charge pump circuit 20B, and electric current αIp is released from the charge pump circuit 20B. Thus, in the case where the charge pump circuit 20B is included in the PLL of embodiment 1 or 2, the PLL has substantially the same circuit structure as that of a conventional PLL, but only the size of a capacitive element of the loop filter is decreased.

Embodiment 3

Figure 6:
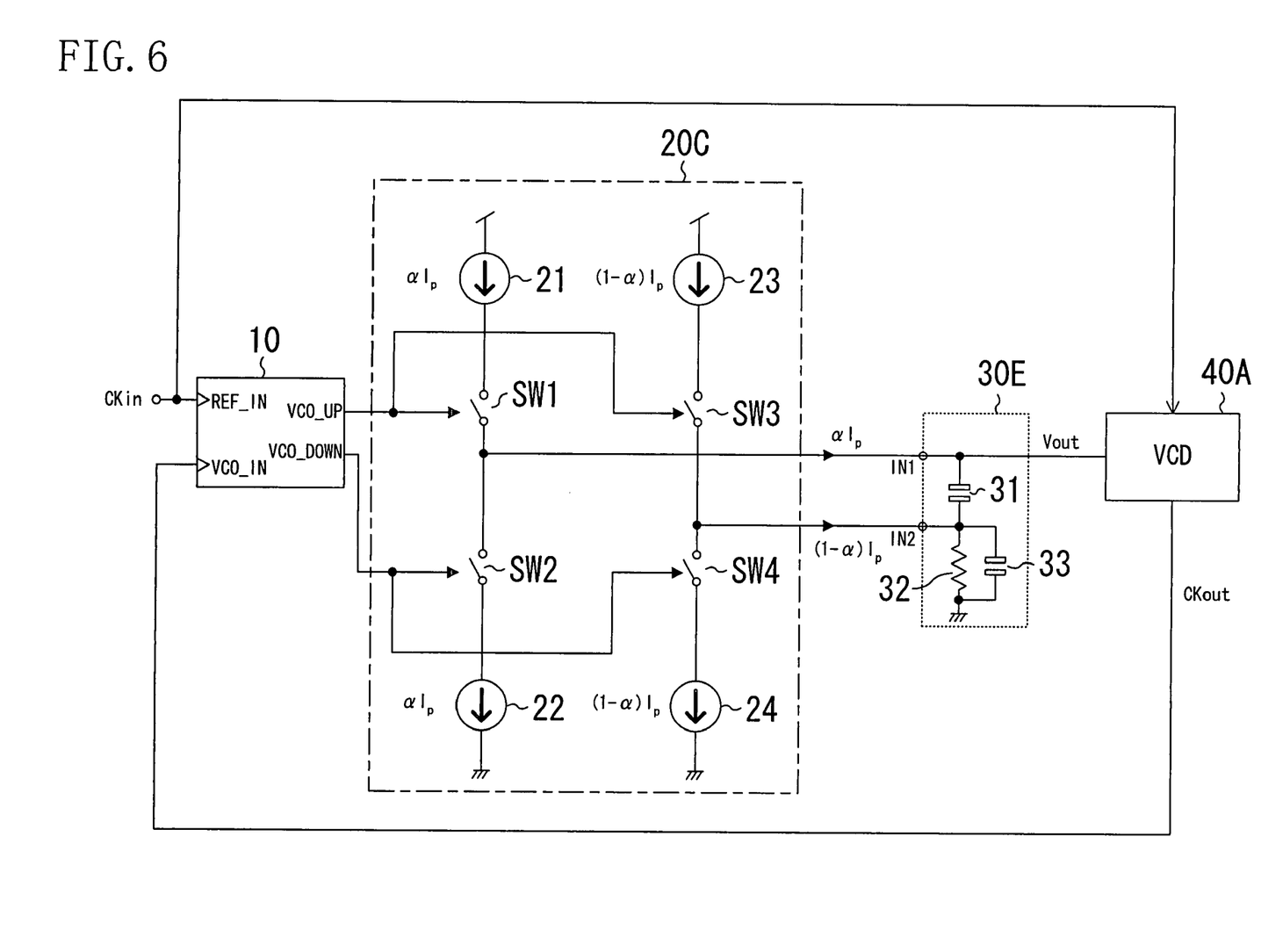
FIG. 6 shows the structure of a feedback system according to embodiment 3 of the present invention.

FIG. 6 shows the structure of a feedback system according to embodiment 3 of the present invention. The feedback system of embodiment 3 is a delay locked loop circuit (hereinafter, referred to as "DLL") including a phase comparator 10, a charge pump circuit 20C, a loop filter 30E, and a voltage controlled delay circuit (output clock generation means) 40. Hereinafter, the charge pump circuit 20C and the loop filter 30E are described in detail.

The charge pump circuit 20C includes current sources 21 and 23 for charge, which supply electric currents αIp and (1−α)Ip, respectively, and current sources 22 and 24 for discharge as does the above-described charge pump circuit 20B. When signal UP is supplied, control switches SW1 and SW3 are brought into conduction so that electric currents αIp and (1−α)Ip are released. On the other hand, when signal DN is supplied, control switches SW2 and SW4 are brought into conduction so that electric currents αIp and (1−α)Ip are sucked. That is, two lines of electric currents, which are obtained by interiorly dividing electric current Ip with the ratio of α:(1−α), are output from/input to the charge pump circuit 20C.

Electric currents αIp and (1−α)Ip output from/input to the charge pump circuit 20C are input to the loop filter 30E at input terminals IN1 and IN2, respectively. In the loop filter 30E, a capacitive element (first element block) 31 is provided between input terminal IN1 and input terminal IN2. Further, between input terminal IN2 and a reference voltage, there are a resistive element 32 and a capacitive element 33, which are connected in parallel and constitute the second element block. The loop filter 30E outputs voltage Vout of input terminal IN1, i.e., a total voltage generated in the capacitive element 31 and the resistive element 32.

In the loop filter 30E, electric current αIp supplied at input terminal IN1 flows through the capacitive element 31, and the resistive element 32 and the capacitive element 33 which are connected in parallel. Electric current (1−α)Ip is supplied to input terminal IN2 in the same direction as that of electric current αIp and flows through the resistive element 32 and the capacitive element 33 which are connected in parallel. Thus, only a part of the electric current flowing through the resistive element 32 and the capacitive element 33, which are connected in parallel, is allowed to flow through the capacitive element 31. Accordingly, the static capacitance of the capacitive element 31 may be relatively decreased. The total voltage generated in a downsized version of the capacitive element 31 and the resistive element 32 is equal to the voltage generated when electric current Ip is supplied at input terminal IN1 in the structure where input terminal IN2 is not provided, and the size of the capacitive element 31 is not decreased.

Figure 7:
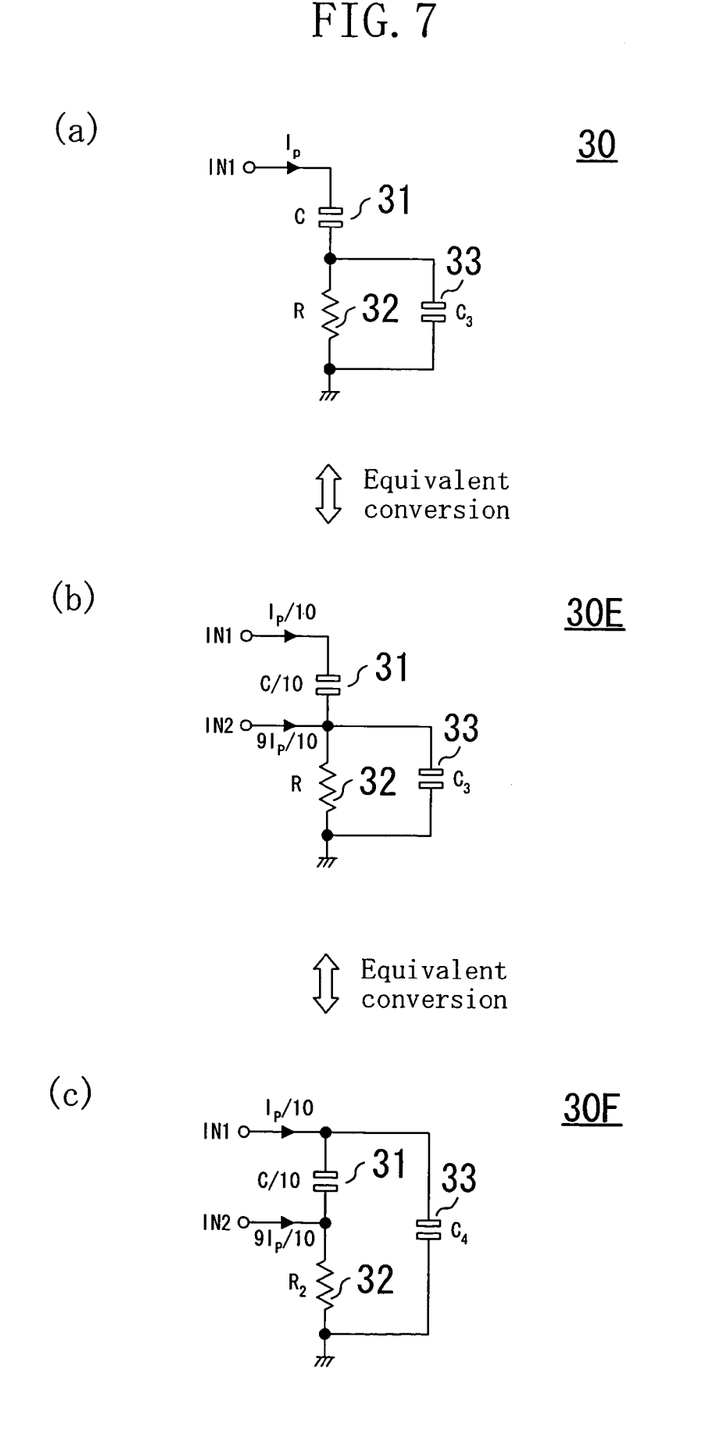
FIGS. 7A–7C show circuit diagrams of a general passive filter and low-pass filters according to embodiment 3 of the present invention.

FIG. 7 shows circuit structures of a general passive filter and low-pass filters according to embodiment 3 of the present invention. The loop filter 30 shown in part (a) of FIG. 7 is a general low-pass filter having a transfer characteristic equivalent to that of the loop filter 30 shown in FIG. 14A. Herein, the electric current supplied to input terminal IN1 and the static capacitance of the capacitive element 31 are multiplied by 1/10. Input terminal IN2 is provided between the capacitive element 31 and the resistive element 32. Electric current 9Ip/10 is supplied at input terminal IN2 in the same direction as that of electric current Ip/10 supplied at input terminal IN1. As a result, a low-pass filter shown in part (b) of FIG. 7, i.e., the loop filter 30E of embodiment 3, is obtained. The loop filter 30 shown in part (a) of FIG. 7 and the loop filter 30E shown in part (b) of FIG. 7 have the same transfer function which is substantially expressed by expression (1).

As described above, the loop filter 30E of embodiment 3 has a transfer characteristic equivalent to that of the general passive loop filter 30, but the static capacitance of the capacitive element 31 in the loop filter 30E is smaller than in the conventional loop filter 30. The reduction in the static capacitance of the capacitive element 31 does not require an increase in the resistance value of the resistive element 32 as compensation. Further, it is not necessary to additionally provide an adder circuit for adding together the voltage generated in the capacitive element 31 and the voltage generated in the resistive element 32. Furthermore, the circuit size of the charge pump circuit 20C does not increase as compared with a conventional one. That is, a loop filter and PLL, which have greatly reduced sizes as compared with the conventional passive loop filter 30 and PLL, is realized only by providing input terminal IN2 and supplying a predetermined electric current thereto without making any modification to the circuit structures of the conventional passive loop filter 30 and PLL.

The loop filter 30E can be equivalently converted to a loop filter 30F shown in part (c) of FIG. 7 by adjusting respective element values so as to satisfy the condition of expression (2). The loop filter 30F includes a capacitive element (first element block) 31, a resistive element (second element block) 32 which is connected in series to the capacitive element 31, and a capacitive element (third element block) 33 which is connected to input terminal IN1. One end of the capacitive element 33 is connected to the reference voltage. Thus, the circuit structure of the loop filter 30F is substantially the same as that of the conventional passive filter shown in FIG. 14A. In FIG. 6, as a matter of course, the loop filter 30E may be replaced with the loop filter 30F.

Figure 8:
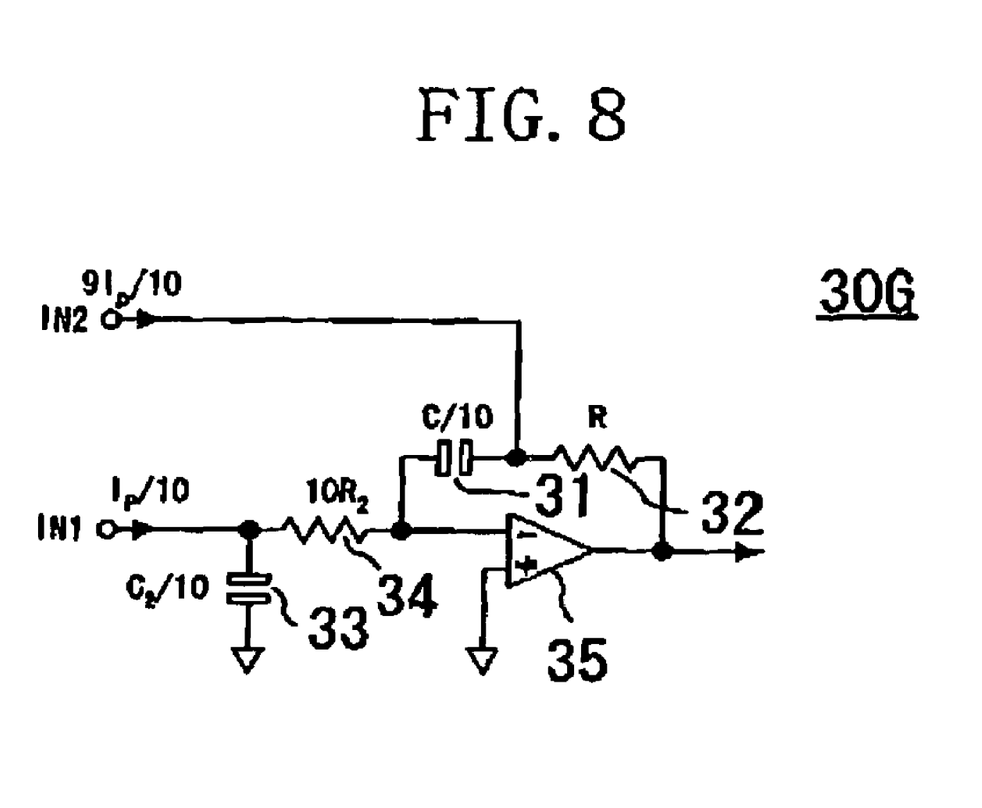
FIG. 8 is a circuit diagram of an active filter which is applicable to the feedback system of embodiment 3 of the present invention.

Alternatively, the loop filter 30E in FIG. 6 may be replaced with an active loop filter 30G shown in FIG. 8. The loop filter 30G is obtained by modifying the loop filter 30C shown in part (b) of FIG. 4 such that the capacitive element 31 and the resistive element 32 are replaced with each other, the direction of the electric current supplied to input terminal IN2 is inverted, the electric current supplied to input terminal IN1 and the static capacitance of the capacitive element 33 are each multiplied by ⅒, and the resistance value of the resistive element 34 is multiplied by 10. Thus, the loop filter 30C and the loop filter 30G have the same transfer characteristic.

In the loop filter 30G, the static capacitance of the capacitive element 33 is decreased, but accordingly, the size of the resistive element 34 is increased. The electric current flowing into the operational amplifier 35 is relatively large as compared with the loop filter 30C. However, considering the decrease in size of the capacitive element 31, the loop filter 30G is capable of sufficiently achieving such an objective.

As described above, according to embodiment 3, a loop filter having a transfer characteristic equivalent to that of a conventional loop filter is realized only by decreasing the static capacitance of a capacitive element without making any substantial modification to the circuit structure of the conventional loop filter. Further, it is not necessary to substantially change the circuit structure of a charge pump circuit in a conventional feedback system. That is, only the size of the capacitive element in the loop filter can be decreased without making any substantial modification to the entire circuit structure of the conventional feedback system.

Also in embodiment 3, the static capacitance of the capacitive element 31 may be reduced to a ¹⁄₁₀₀ by supplying, for example, electric currents Ip/100 and 99Ip/100 to input terminals IN1 and IN2, respectively. It is apparent that the static capacitance of the capacitive element 31 may further be reduced.

In embodiment 3, a DLL is constructed as the feedback system, but the present invention is not limited thereto. For example, a PLL may be constructed using the above-described charge pump circuit 20C, loop filter 30E, or the like. Conversely, the charge pump circuit 20A and the loop filter 30A of embodiments 1 and 2, or the like, may be used to construct a DLL.

As a matter of course, a low-pass filter of the present invention is also usable for applications other than a loop filter in a feedback system.

(Applications of the Feedback System of the Present Invention)

As described above, the feedback system of the present invention does not require a large capacitive element, and therefore, the circuit size thereof is reduced. Thus, applications to the products described below are especially expected.

Figure 9:
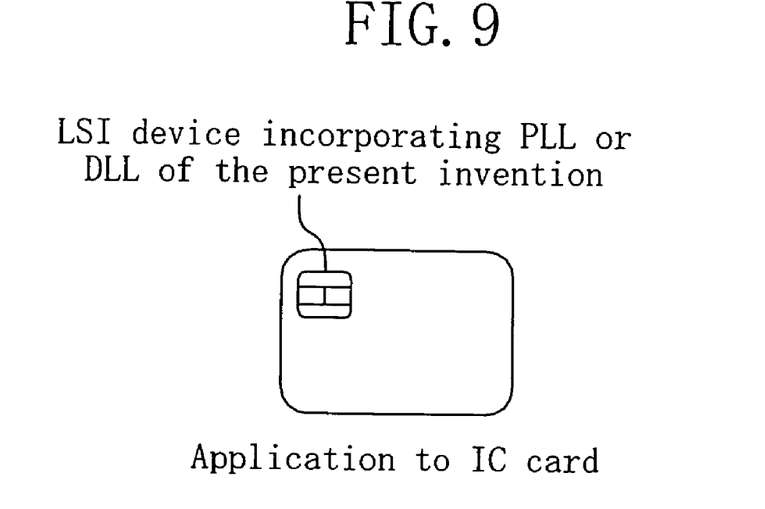
FIG. 9 shows an application of a feedback system of the present invention to an IC card.

FIG. 9 is an example of an LSI device for an IC card, which incorporates a PLL or DLL of the present invention. An LSI device used for IC cards has a limited installation area, and therefore, the PLL or DLL of the present invention which can be structured with a smaller circuit area is especially suitable for use in an IC card.

Figure 10:
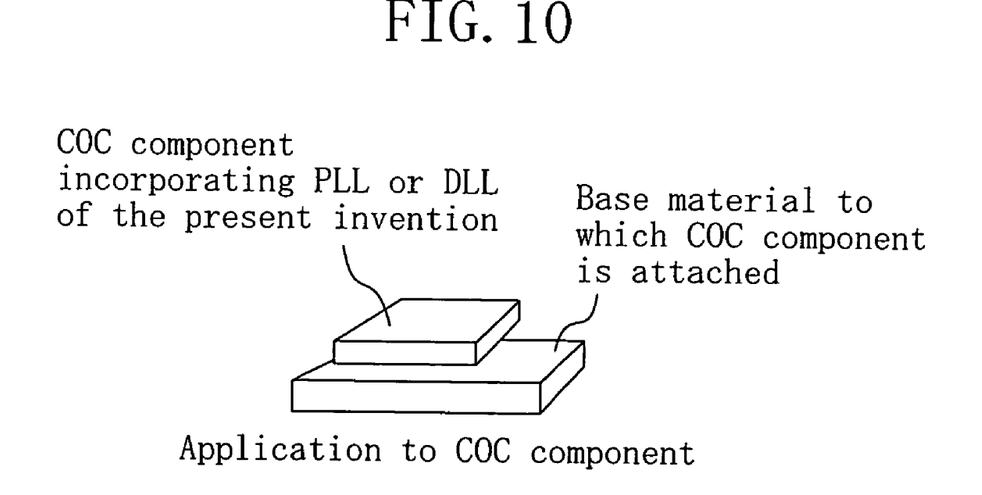
FIG. 10 shows an application of a feedback system of the present invention to a COC component.

FIG. 10 shows an application of the PLL or DLL of the present invention to a chip-on-chip (COC) component. In a chip-on-chip structure, the circuit area of a semiconductor integrated circuit of the upper layer is limited, and therefore, the PLL or DLL of the present invention is effective in such a case.

Figure 11:
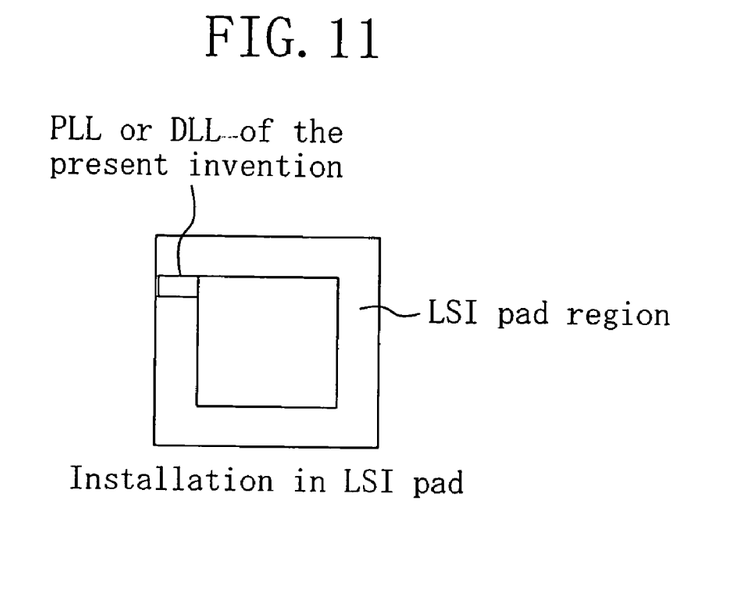
FIG. 11 shows an example of installation of a feedback system of the present invention in an LSI pad region.

FIG. 11 shows an application of the PLL or DLL of the present invention to an LSI pad region. The circuit area available for installation is also limited as described above as to the chip-on-chip structure. Therefore, the PLL or DLL of the present invention is accordingly effective in such a case.

Figure 12:
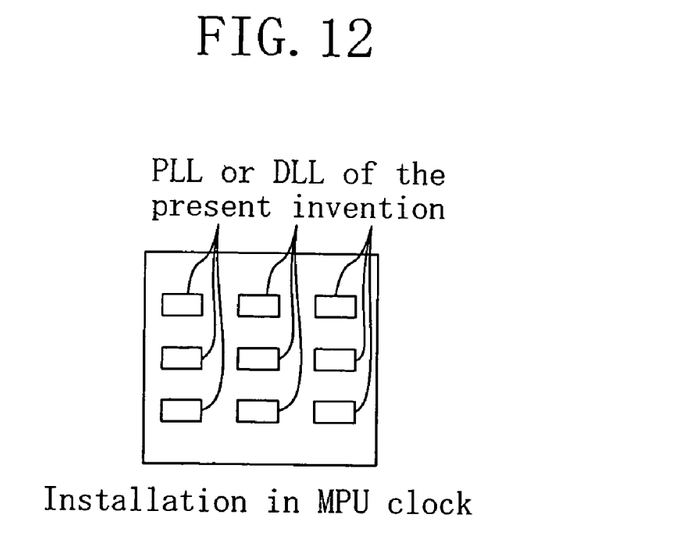
FIG. 12 shows an example of installation of a feedback system of the present invention in a microprocessor.

FIG. 12 is an example of the PLLs or DLLs of the present invention which are installed as clock generation means in a microprocessor. In currently-existing microprocessors, a large number of PLLs or DLLs are incorporated. Therefore, using the PLLs or DLLs of the present invention in a microprocessor raises the expectation that the entire circuit area of the microprocessor is greatly reduced. Thus, the effects obtained by applying the PLLs or DLLs of the present invention to a microprocessor are significantly large.

As described above, according to the present invention, the size of a capacitive element in a low-pass filter is decreased without any compensation, such as an increase in the circuit area, the circuit complexity, or the resistance value. A low-pass filter of the present invention is used as a loop filter, whereby a feedback system having a greatly decreased size as compared with a conventional loop filter is realized.

The circuit structures of a low-pass filter and a feedback system of the present invention are quite simple and therefore can readily be implemented. Further, according to the present invention, the circuit structures are substantially the same as conventional circuit structures. Therefore, the present invention is advantageous in that the accumulated designing methodologies can be inherited as they are.

What is claimed is:

1. A low-pass filter, comprising:
   a first element block having a capacitive element;
   a second element block having a resistive element, the second element block being connected in series to the first element block;
   a first input terminal for receiving a first electric current, the first input terminal being provided at a side including the second element block;

a second input terminal for receiving a second electric current, the second input terminal being connected to a connection point of the first element block and the second element block; and an operational amplifier having a normal phase input terminal, an inverted phase input terminal, and an output terminal, the first and second element blocks being provided between the inverted phase input terminal and the output terminal, the normal phase input terminal being supplied with a reference voltage, wherein the first input terminal is provided at a side including the inverted phase input terminal of the operational amplifier, the second electric current is an electric current whose direction is the same as that of the first electric current and whose magnitude is N times that of the first electric current (where N is a predetermined number), and a total voltage generated in the first and second element blocks is employed as an output signal.

2. A low-pass filter, comprising:

a first element block having a capacitive element;

a second element block having a resistive element, the second element block being connected in series to the first element block;

an operational amplifier having a normal phase input terminal, an inverted phase input terminal, and an output terminal, the first and second element blocks being provided between the inverted phase input terminal and the output terminal, the normal phase input terminal being supplied with a reference voltage;

a first input terminal for receiving a first electric current;

a second input terminal for receiving a second electric current, the second input terminal being connected to the inverted phase input terminal of the operational amplifier; and a third element block having a capacitive element and a resistive element, the capacitive element being provided between the first input terminal and the reference voltage, the resistive element being provided between the first input terminal and the inverted phase input terminal of the operational amplifier, wherein the second electric current is an electric current whose direction is opposite to that of the first electric current and whose magnitude is N times that of the first electric current (where N is a predetermined number), and a total voltage generated in the first and second element blocks is employed as an output signal.

3. A feedback system for feeding back an output clock generated based on an input clock such that the output clock has a predetermined characteristic, comprising:

a loop filter including a first element block which has a capacitive element, a second element block which has a resistive element and is connected in series to the first element block, a first input terminal for receiving a first electric current, and a second input terminal for receiving a second electric current, which is connected to a connection point of the first and second element blocks, a total voltage generated in the first and second element blocks being employed as an output signal;

a charge pump circuit for generating the first and second electric currents based on a phase difference between the input clock and the fed-back clock; and output clock generation means for generating the output clock based on the output signal from the loop filter, wherein the first input terminal of the loop filter is provided at the side including the first element block;

the direction of the second electric current is the same as that of the first electric current, and the magnitude of the second electric current is N times that of the first electric current (where N is a predetermined number); and the charge pump circuit includes a first partial charge pump circuit which outputs/receives the first electric current and a second partial charge pump circuit which outputs/receives the second electric current.

4. A semiconductor integrated circuit comprising the feedback system of claim 3.

5. The semiconductor integrated circuit of claim 4, wherein the semiconductor integrated circuit is used in an IC card.

6. The semiconductor integrated circuit of claim 4, wherein:

the semiconductor integrated circuit has a chip-on-chip structure; and the feedback system exists in an upper layer of the chip-on-chip structure.

7. The semiconductor integrated circuit of claim 4, wherein the feedback system exists on a pad of the semiconductor integrated circuit.

8. The semiconductor integrated circuit of claim 4, wherein the semiconductor integrated circuit is a microprocessor.

9. The feedback system of claim 3, wherein the output clock generation means is a voltage controlled oscillator which oscillates the output clock and changes the oscillation frequency based on the output signal from the loop filter.

10. The feedback system of claim 3, wherein the output clock generation means is a voltage controlled delay circuit which changes a delay amount of the output clock with respect to the input clock based on the input clock and the output signal from the loop filter.

* * * * *